(12) United States Patent
Dedic et al.

(10) Patent No.: US 7,065,168 B2
(45) Date of Patent: Jun. 20, 2006

(54) JITTER REDUCTION

(75) Inventors: Ian Juso Dedic, Northolt (GB); William George John Schofield, Binfield (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/382,459

(22) Filed: Aug. 25, 1999

(65) Prior Publication Data

US 2003/0190007 A1    Oct. 9, 2003

(30) Foreign Application Priority Data

Sep. 4, 1998    (GB) .................................. 9819414

(51) Int. Cl.
  *H04L 7/00*    (2006.01)
(52) U.S. Cl. ...................... 375/354; 375/356; 375/371; 375/373; 375/377; 327/141; 327/261; 370/503; 714/700
(58) Field of Classification Search ................ 375/377, 375/371, 247, 356, 372, 149, 261, 354, 357, 375/373; 341/126, 118, 143, 144; 327/12, 327/141, 231, 261, 151–153, 160–161, 144; 370/503; 714/700
See application file for complete search history.

(56) References Cited

U.S. PATENT DOCUMENTS 4,947,171 A * 8/1990 Pfeifer et al. ................ 341/143
5,272,729 A * 12/1993 Bechade et al. ............. 375/371
5,479,455 A * 12/1995 Hata ........................... 375/356

FOREIGN PATENT DOCUMENTS

| GB | 2 215 925 | 9/1989 |
| GB | 2 333 171 | 7/1999 |

* cited by examiner

*Primary Examiner*—Khai Tran
*Assistant Examiner*—Edith Chang
(74) *Attorney, Agent, or Firm*—Staas & Halsey LLP

(57) ABSTRACT

Decoders process a digital input word to derive thermometer-coded signals for controlling one cell of an array of cells, commencing operation at the rising edge of a first clock signal. Each cell has a first latch clocked by a second clock signal, delayed by a preselected delay time $\Delta^1$ relative to the first clock signal, and a second, transparent latch clocked by a third clock signal whose rising edge coincides with the rising edge of the first clock signal and whose falling edge coincides with the rising edge of the second clock signal. The rising edge of the third clock signal is not affected by jitter associated with a delay element used to delay the first clock signal by $\Delta^1$. The falling edge is affected by such jitter, but is prevented from feeding through to final outputs because the second latch is non-transparent at that falling edge.

34 Claims, 8 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

JITTER REDUCTION

BACKGROUND OF THE INVENTION

1. Field of the Invention

The present invention relates to jitter reduction techniques for use particularly but not exclusively in mixed-signal circuitry and integrated circuit devices, for example digital-to-analog converters (DACs). Such mixed-signal circuitry and devices include a mixture of digital circuitry and analog circuitry.

2. Description of the Related Art

FIG. 1 of the accompanying drawings shows parts of a conventional DAC integrated circuit (IC) of the so-called "current-steering" type. The DAC 1 is designed to convert an m-bit digital input word (D1–Dm) into a corresponding analog output signal.

The DAC 1 contains analog circuitry including a plurality (n) of identical current sources $2_1$ to $2_n$, where $n=2^m-1$. Each current source 2 passes a substantially constant current I. The analog circuitry further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ Of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by digital circuitry including a binary-thermometer decoder 6. The decoder 6 operates as follows.

When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n–i differential switching circuits $4_{i+1}$ to $4_n$ select their respective second terminals. The analog output signal $V_A-V_B$ is equal to $(2i-n)IR$.

FIG. 2 shows an example of the thermometer-coded signals generated for a three-bit binary input word D1–D3 (i.e. in this example m=3). In this case, seven thermometer-coded signals T1 to T7 are required ($n=2^m-1=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr–1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

However, when it is desired to operate such a DAC at very high speeds (for example 100 MHz or more), it is found that glitches may occur at one or both of the first and second connection lines A and B, producing a momentary error in the DAC analog output signal $V_A-V_B$. These glitches in the analog output signal may be code-dependent and result in harmonic distortion or even non-harmonic spurs in the output spectrum.

The present inventors have investigated the causes of these glitches, and have determined some of the causes to be as follows.

Firstly, the digital circuitry (the binary-thermometer decoder 6 and other digital circuits) is required to switch very quickly and its gate count is quite high. Accordingly, the current consumption of the digital circuitry could be as much as 20 mA per 100 MHz at high operating speeds. This combination of fast switching and high current consumption inevitably introduces a high degree of noise into the power supply lines. Although it has previously been considered to separate the power supplies for the analog circuitry (e.g. the current sources $2_1$ to $2_n$ and differential switching circuits $4_1$ to $4_n$ in FIG. 1) from the power supplies for the digital circuitry, this measure alone is not found to be wholly satisfactory when the highest performance levels are required. In particular, noise arising from the operation of the binary-thermometer decoder 6 can lead to skew in the timing of the changes in the thermometer-coded signals T1 to Tn in response to different changes in the digital input word D1 to Dm. For example, it is estimated that the skew may be several hundreds of picoseconds. This amount of skew causes significant degradation of the performance of the DAC and, moreover, being data-dependent, the degradation is difficult to predict.

Secondly, in order to reduce the skew problem mentioned above, it may be considered to provide a set of latch circuits, corresponding respectively to the thermometer-coded signals T1 to Tn, between the digital circuitry and the analog circuitry, which latches are activated by a common timing signal such that the outputs thereof change simultaneously. However, surprisingly it is found that this measure alone is not wholly effective in removing skew from the thermometer-coded signals. It is found, for example, that data-dependent jitter still remains at the outputs of the latch circuits and that the worst-case jitter increases in approximate proportion to the number of thermometer-coded signals. Thus, with (say) 64 thermometer-coded signals the worst-case jitter may be as much as 20 picoseconds which, when high performance is demanded, is excessively large.

SUMMARY OF THE INVENTION

According to a first aspect of the present invention there is provided digital circuitry, operative repetitively to perform a series of processing cycles, comprising: input signal processing means operable in each cycle to perform a predetermined processing operation on one or more input signals received by the circuitry to derive therefrom one or more first signals, the said predetermined processing operation being commenced in response to a first clock signal; first clocked means switchable, by application thereto of a second clock signal, between a responsive state, in which the first clocked means are operable in response to a change in the first signal(s) to change one or more second signals produced thereby, and a non-responsive state in which the second signal(s) do not change; second clocked means switchable, by application thereto of a third clock signal, between a responsive state, in which the second clocked means are operable in response to a change in the second signal(s) to change one or more output signals of the circuitry, and a non-responsive state in which the output signal(s) do not change; and clock generating means for deriving the second and third clock signals from the first clock signal, the second clock signal being delayed relative to the first clock signal by a preselected delay time and the said third clock signal being delayed relative to the first clock signal by less than the said preselected delay time such that in each cycle the first clocked means enter the said non-responsive state before the end of the said predetermined processing operation, and the said second clocked means enter the said responsive state when the first clocked means are in the said non-responsive state.

In such digital circuitry, by making the second clock signal have the preselected delay time relative to the first clock signal the setup time of the first clocked means can be maximised for a given duration of the predetermined processing operation. Even though the second clock signal introduces jitter dependent upon the preselected delay time, the or each output signal of the circuitry suffers only a lower degree of jitter dependent upon the delay, relative to the first clock signal, of the third clock signal which is less than the preselected delay time. Accordingly, the jitter performance of the circuitry is improved without reducing its speed of operation. The output signal(s) can be applied to any timing-sensitive circuit to cause that circuit to undergo a predetermined operation at a well-defined instant in time.

Preferably the third clock signal has no or no substantial delay relative to the said first clock signal. In this case the jitter performance is improved remarkably to a level equivalent to that of comparable digital circuitry not including a means of delaying the first clock signal, whilst still achieving the maximum clock rate possible when the delay means are present. The third clock signal can even be one and the same signal as the first clock signal, at least when the second clocked means are of the edge-triggered type.

The preselected delay time may be chosen such that the said first clocked means enter the said non-responsive state at least a predetermined hold time before the end of the said predetermined processing operation, which predetermined hold time is the minimum period for which the or each first signal must remain stable after the first clocked means enter the said non-responsive state. This means that the longest possible setup time is available for the first clocked means. As the minimum hold time is tending to zero or negative for modern clocked elements the predetermined hold time can be zero or a very small value.

In practice, the predetermined processing operation may vary in duration from one cycle to the next, for example in dependence upon the change in the input signals from one cycle to the next. In this case, the preselected delay time is chosen to ensure that at least the minimum hold time is obtained before the end of the shortest-possible-duration operation.

When plural circuit units (each including the first and second clocked means as well as at least parts of the input signal processing means) the preselected delay time may be chosen such that the said first clocked means of each circuit unit enter the said non-responsive state at least the above-mentioned predetermined hold time before the end of the said predetermined processing operation in the circuit unit having the fastest input signal processing means. This enables skew in the production of valid first signals amongst the different circuit units to be accommodated. The maximum clock rate of the circuitry is then only really limited by the skew itself, as the minimum setup and hold times of the first clocked means are zero or very small.

In one embodiment the said clock generating means are such that a predetermined enabling change (e.g. a rising edge) in the said third clock signal, which change causes the second clocked means to change from the said non-responsive state to the said responsive state, occurs substantially simultaneously with one of the changes in the said first clock signal, preferably a predetermined enabling change (e.g. a rising edge) in that signal which causes the said predetermined processing operation to commence. A predetermined disabling change (e.g. falling edge) in the third clock signal, which change causes the second clocked means to change from the said responsive state to the said non-responsive state, can then be delayed substantially relative to one of the changes in the first clock signal, without adversely affecting the jitter performance, because until after that disabling change the first clocked means is in the non-responsive state so that the or each second signal is stable.

Advantageously the clock generating means may include: delay means for delaying the first clock signal to produce a delayed version thereof; and logic means for logically combining the first clock signal with the said delayed version thereof such that the said enabling change in the third clock signal is substantially simultaneous with the said enabling change in the said first clock signal, and the said disabling change in the third clock signal is substantially simultaneous with one of the changes in the said delayed version of the first clock signal. The use of such combinatorial logic means (e.g. a simple NAND gate) can enable the third clock signal to be generated simply and, in view of the low propagation delay of combinatorial logic circuitry, without introducing any significant jitter.

The said clock generating means may also further include delay balancing means connected between the said delay means and the said first clocked means for receiving the said delayed version of the first clock signal and for deriving therefrom the said second clock signal. These delay balancing means are designed to have a first propagation delay, between the said one change in the delayed version of the first clock signal and a predetermined enabling change in the said second clock signal, which change causes the first clocked means to change from the said non-responsive state to the said responsive state. This first propagation delay is designed to be substantially equal to a second propagation delay, of the said logic means, between the said one change in the said delayed version and the said disabling change in the third clock signal. The delay balancing means can have, for example, the same elements as the logic means itself, so as to guarantee equality of the first and second propagation delays. If the logic means is a NAND gate the delay balancing means can also be a NAND gate connected for example to simply invert the delayed version of the first clock signal to produce the second clock signal.

By using such delay balancing means it can be ensured that the enabling change in the second clock signal cannot occur before the disabling change in the third clock signal, which would lead to a direct path from the output of the input signal processing means to the output signals of the circuitry in the case in which one or both of the clocked means is/are of the transparent type.

The input signal processing means in one embodiment include further clocked means switchable, by application thereto of the said first clock signal, between a responsive state, in which the said further clocked means are operable in response to a change in the said input signal(s) to change one or more basic signals produced thereby, and a non-responsive state in which the basic signal(s) do not change; and signal processing means for deriving the said one or more first signals from the basic signal(s). In this construction the further clocked means serve to provide stable inputs to the signal processing circuitry at the start of the predetermined processing operation. The signal processing circuitry may be, for example, binary-to-thermometer decoding circuitry.

Each clocked means can be of any suitable type (edge-triggered or transparent) but preferably the first and further clocked means each include a full latch element (e.g. D-type element) and the second clocked means include a transparent half latch element. The use of the full latches simplifies the timing requirements for the various clock signals because the full latches only enter the responsive state at an actual clock edge. On the other hand the half latch in the second clocked means is advantageous in reducing the number of transistors drawing current when the second clocked means transition. It is possible, for example, to provide a special (independent) power supply for the section of the circuitry including the second clocked means so as to reduce jitter in the second clocked means arising from power supply fluctuations in the circuitry as a whole. In this case it is particularly useful to reduce the power drawn from the separate supply provided for the section of the circuitry including the second clocked means.

The said first signals and/or the said second signals and/or the said third signals and/or the said output signals may be complementary signal pairs and/or thermometer-coded signals. This reduces the power supply fluctuations (and hence jitter) associated with transitions in these signals.

When plural circuit units are provided, each circuit unit including such input signal processing means and such first clocked means and such second clocked means, it also helps in reducing jitter to make some parts of the clock generating means common to all units with other parts thereof provided for the units individually or in small groups. For example, the clock generating means may include: a global clock generator provided in common for all the said circuit units and operable to produce a basic clock signal; and a plurality of local clock drivers, each corresponding to one or more of the said circuit units, and each being connected to the global clock generator for receiving therefrom the said basic clock signal and being operable to derive therefrom a unique such third clock signal for application to the said second clocked means in the or each of its said one or more corresponding circuit units. This construction is advantageous because it is found that the clock distribution line or lines connecting the global clock generator to the individual local clock buffers is/are affected much less by changes of state in the second clocked means when the local clock buffers are provided.

Ideally, each said circuit unit has its own individually-corresponding one of the said local clock drivers.

Preferably the said global clock generator is operable to produce respective mutually-complementary such basic clock signals which are applied in common to all of the said local clock drivers of the said plurality. In this case two clock distribution lines are used which undergo complementary changes so reducing the effect of parasitic capacitances associated with these relatively long lines.

The power supplies of at least some critical parts (e.g. the second clocked means and/or the local clock buffer) of the different circuit units are preferably decoupled from one another to further reduce jitter.

According to a second aspect of the present invention there is provided mixed-signal circuitry including: digital circuitry embodying the aforesaid first aspect of the present invention; and analog circuitry connected to the said digital circuitry for receiving therefrom the said one or more output signals and operable to produce one or more analog signals in dependence upon the received output signal(s).

In such mixed-signal circuitry the analog circuitry receives reduced-jitter (or even entirely-jitter-free) output signals from the digital circuitry, greatly reducing glitches in the produced analog signals. The improvement is particularly significant when the mixed-signal circuitry has plural circuit units ("cells") which each have timing-sensitive analog circuits that must all operate together at a single well-defined instant or at staggered but well-defined instants.

The mixed-signal circuitry may be (or include) a digital-to-analog converter or a mixer.

For example the analog circuitry may include a plurality of current sources or current sinks and a plurality of switch circuits connected to the current sources/sinks for performing predetermined switching operations in dependence upon the said output signal(s) so as to produce the said one or more analog signals.

Advantageously, power is supplied to the said analog circuitry independently of the power supplied to the or each said second clocked means and (if supplied separately) to the other parts of the digital circuitry. In this way the analog circuitry can be isolated from the effects of transitions in the digital circuitry.

DETAILED DESCRIPTION OF THE PREFERRED EMBODIMENTS

Figure 3:
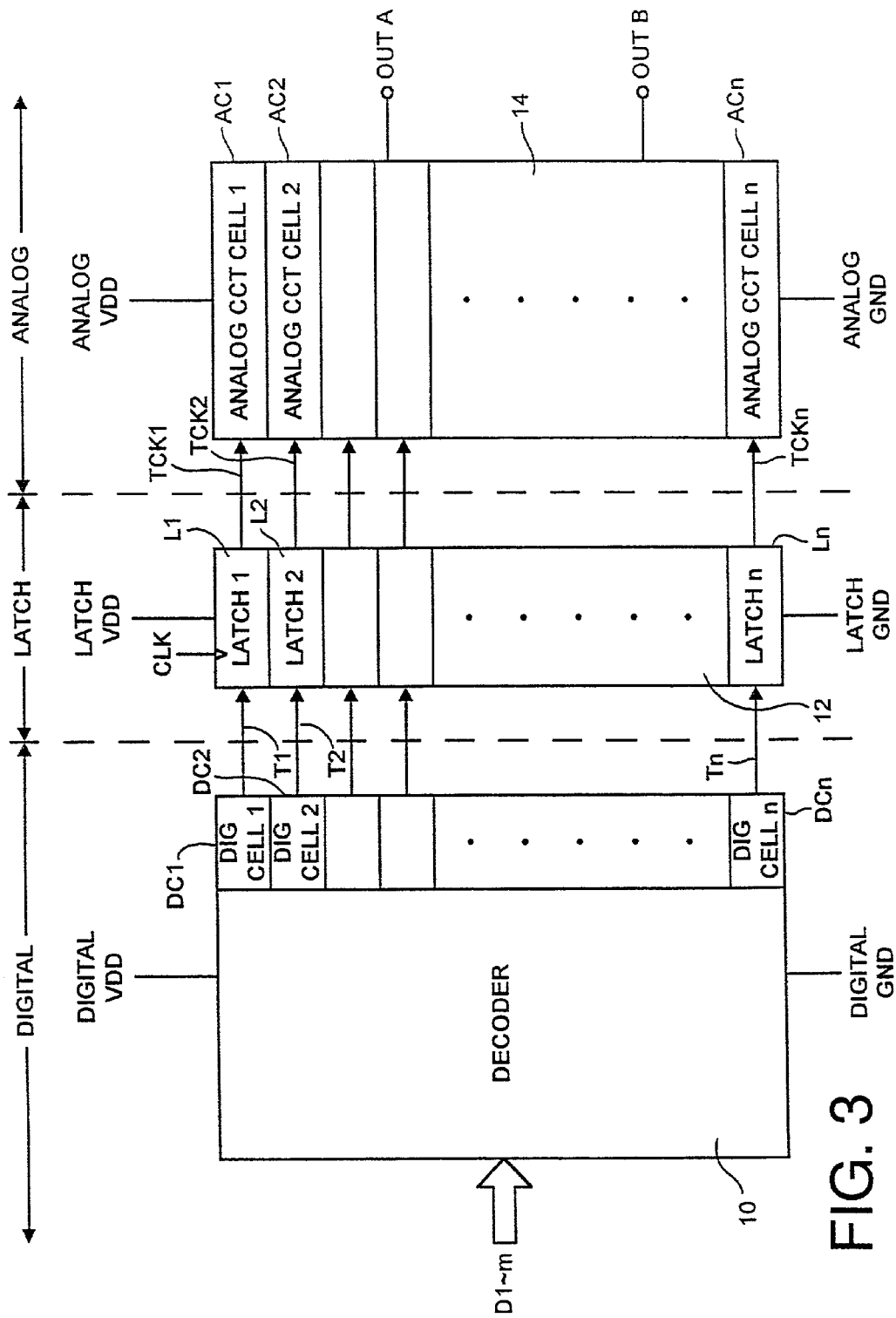
FIG. 3 shows parts of a DAC IC to which an embodiment of the present invention can be applied.

FIG. 3 shows parts of a DAC IC embodying the present invention. The FIG. 3 circuitry is divided into three sections: a digital section, a latch section and an analog section. The latch section is interposed between the digital and analog sections.

The digital section comprises decoder circuitry 10, which is connected to other digital circuitry (not shown) to receive an m-bit digital input word D1~Dm. The decoder circuitry 10 has an output stage made up of n digital circuits DC1 to DCn which produce respectively thermometer-coded signals T1 to Tn based on the digital input word, for example in accordance with the table of FIG. 2 discussed hereinbefore.

The latch section comprises a set 12 of n latch circuits L1 to Ln. Each latch circuit is connected to receive an individually-corresponding one of the thermometer-coded signals T1 to Tn produced by the decoder circuitry 10. Each latch circuit L1 to Ln also receives a clock signal CLK. The latch circuits L1 to Ln produce at their outputs respective clocked thermometer signals TCK1 to TCKn that correspond respectively to the thermometer-coded signals T1 to Tn produced by the decoder circuitry 10.

In each cycle of the DAC IC a new sample of the digital input word D1~Dm is taken and so the thermometer-coded signals T1 to Tn normally change from one cycle to the next. In each cycle, it inevitably takes a finite time for these signals to settle to their intended final values from the moment the new sample is taken. Also, inevitably some digital circuits DC1 to DCn will produce their respective thermometer-coded signals earlier than others. By virtue of the clocked operation of the latch circuits L1 to Ln, the clocked thermometer signals TCK1 to TCKn can be prevented from changing until all the thermometer-coded signals T1 to Tn have settled to their intended values for a particular cycle of the DAC.

The analog section comprises a set 14 of n analog circuits AC1 to ACn. Each of the analog circuits AC1 to ACn receives an individually-corresponding one of the clocked thermometer signals TCK1 to TCKn. The analog circuits AC1 to ACn each have one or more analog output terminals and signals produced at the analog output terminals are combined appropriately to produce one or more analog output signals. For example, currents may be summed by summing connection lines as in FIG. 1. Two such analog output signals OUTA and OUTB are shown in FIG. 3 by way of example.

In the FIG. 3 circuitry, each digital circuit DC1 to DCn, together with its corresponding latch circuit L1 to Ln and its corresponding analog circuit AC1 to ACn, constitutes a so-called "cell" of the DAC. Thus, each cell includes a digital circuit DC, a latch circuit L and an analog circuit AC. The digital circuit DC produces a first digital signal (thermometer-coded signal) T for its cell. The latch circuit for the cell receives the first digital signal T and delivers to the analog circuit AC of the cell a second digital signal (clocked thermometer signal) TCK corresponding to the first digital signal T once the first digital signals of all cells have settled to their final intended values. Thus, the latch circuit serves as a signal control circuit for deriving the second digital signal from the first digital signal and controlling the timing of its application to the analog circuit AC. The second digital signal TCK serves as a control signal for use in controlling a predetermined operation of the analog circuit AC of the cell. This predetermined operation may be any suitable type of operation of the cell. For example, it could be a switching or selection operation for switching on or off, or controlling the output path of, an analog output signal of the cell. An example of the analog circuit AC of a cell is given later with reference to FIG. 9.

As shown in FIG. 3, each section of the circuitry (digital, latch and analog) has its own independent power supply connections, for example a positive power supply potential VDD and a negative power supply potential or electrical ground GND. Thus, the digital section has a DIGITAL VDD and a DIGITAL GND; the latch section has a LATCH VDD and a LATCH GND; and the analog section has an ANALOG VDD and ANALOG GND. These different VDD and GND supplies are received at different respective power supply pins of the DAC IC (chip). Thus, if desired the potentials of the supplies to each section can be different from one another. Typically, however, for convenience a single power supply will be used off-chip to provide the power supplies for each of the different sections, and a circuit board on which the chip is mounted will contain suitable circuitry for delivering the different power supplies to the appropriate power supply pins of the chip whilst decoupling the different supplies from one another using inductance and capacitance elements in known manner.

Within the integrated circuit itself, there are a number of ways in which coupling between the power supplies of the three different sections can be prevented. Details of these are provided in our co-pending United Kingdom Patent Application No. 9804587.5.

Figure 4:
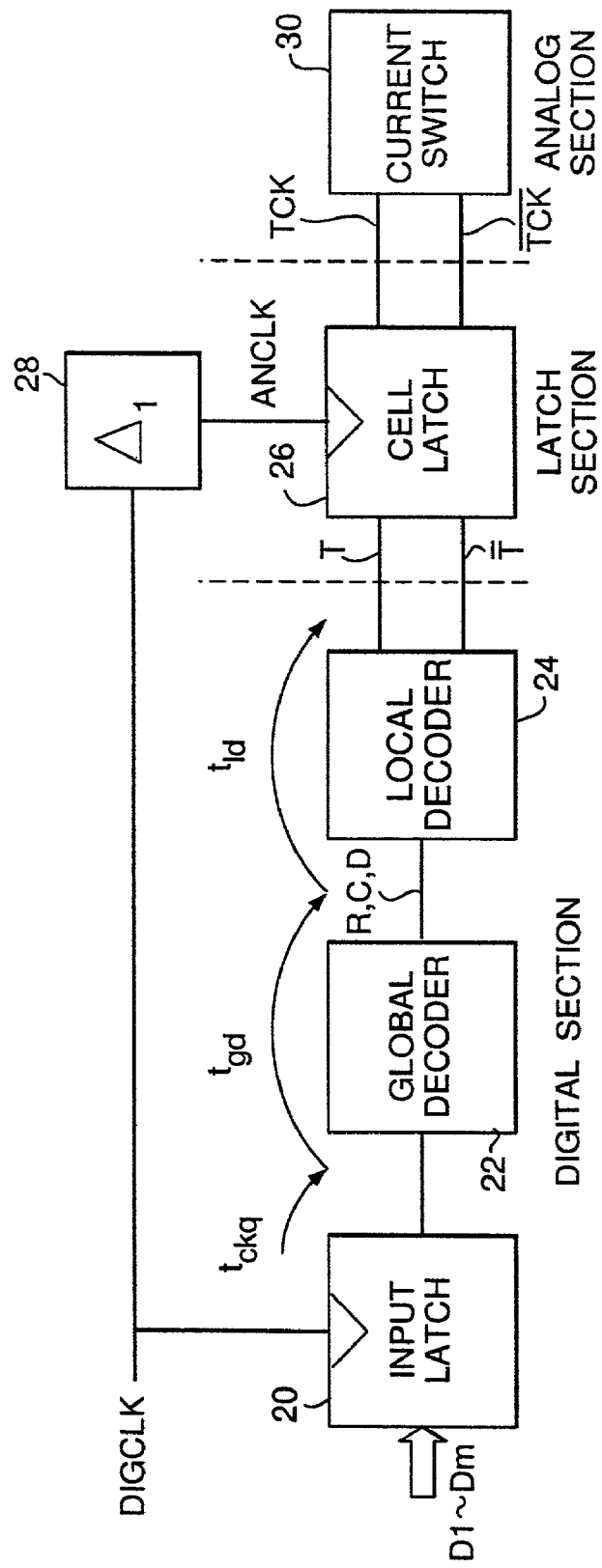
FIG. 4 shows parts of digital circuitry previously considered for use in the FIG. 3 DAC IC.

FIG. 4 shows circuitry previously considered for inclusion in (or use in association with) one of the cells. As shown in FIG. 4, the circuitry is divided into respective digital, latch and analog sections as in FIG. 3. The digital section includes an input latch 20 connected for receiving the digital input word D1~Dm. The input latch 20 also receives a clock signal DIGCLK which is, for example, applied externally to the DAC IC. The input latch 20 may be of the positive edge-triggered D-type, for example.

The FIG. 4 circuitry also comprises respective global and local decoders 22 and 24 which correspond to parts of the decoder 10 in FIG. 3. The global decoder 22 receives the input word D1~Dm (or parts thereof) from the latch 20 and decodes it into two or more sets (or dimensions) of thermometer-coded signals (referred to as row and column signals, or row, column and depth signals). These two or more sets of signals are delivered to a plurality of local decoders which correspond respectively to the cells. Only one of these local decoders is shown in FIG. 4. Each local decoder only needs to receive and decode a small number (2 or 3) of the signals in the sets produced by the global decoder. The local decoders can be regarded as arranged logically (not necessarily physically as well) in two or more dimensions corresponding respectively to the sets of thermometer-coded signals. The local decoders are effectively addressed by the sets of thermometer-coded signals and, using simple combinatorial logic, derive respective "local" thermometer-coded signals T for their respective cells.

Thus, in FIG. 4 the particular local decoder 24 is connected to receive a small number (represented schematically by respective row, column and depth signals R, C, D) of the signals in the sets of row, column and depth signals produced by the global decoder 22. The local decoder 24 derives the complementary thermometer-coded signals T and T̄ for its particular cell based on the received R, C and D signals. Further details of such "two-stage" thermometer-decoding involving global and local decoders may be found, for example, in our co-pending United Kingdom Patent Application No. 9800384.1.

The latch section of the FIG. 4 circuitry comprises a cell latch 26 which is of the differential type having its two data inputs connected respectively to the outputs of the local decoder 24 for receiving therefrom the thermometer-coded complementary output signals T and T̄. The cell latch 26 is of the positive edge-triggered D-type, for example, and receives at its clock input a clock signal ANCLK. The ANCLK signal is derived from the externally-applied DIGCLK signal by a delay element 28 which imposes a nominally-fixed delay $\Delta_1$ on the received DIGCLK signal.

The outputs of the cell latch 26 produce respective complementary clocked thermometer-coded signals TCK and T̄C̄K̄ corresponding respectively to the T and T̄ signals.

The analog section of the FIG. 4 circuitry comprises a current switch 30 having complementary inputs connected to the outputs of the cell latch 26 for receiving therefrom the clocked thermometer signals TCK and T̄C̄K̄.

Operation of the FIG. 4 circuitry will now be described with reference to FIGS. 5A and 5B.

The FIG. 4 circuitry operates in a pipeline manner, based on successive cycles of the DIGCLK clock signal. Each cycle commences at the rising edge of the DIGCLK signal. Thus, as shown in FIG. 5A, a cycle i−1 ends, and the next cycle i begins, at the first rising edge of the DIGCLK signal in FIG. 5A. Cycle i ends, and the next cycle i+1 begins, at the second rising edge of the DIGCLK signal in FIG. 5A.

The input latch 20 is triggered at the start of each cycle (by the rising edge of DIGCLK) so that the output thereof changes a propagation time $t_{ckq}$ after the start of the cycle. The global and local decoders 22 and 24 operate in response to the change in the outputs of the first latch 20, the global decoder 22 having a propagation time $t_{gd}$ and the local decoder 24 having a propagation time $t_{ld}$. Thus, the complementary outputs T and T̄ of the local decoders 24 change a combined propagation time $t_{ckq} + t_{gd} + t_{ld}$ after the start of the cycle. There is inevitably some variation, or skew, between the times at which the local decoders 24 of the different cells have their T and T̄ signals ready. Thus, as shown in FIG. 5A, it is only known that the T and T̄ signals for a particular local decoder 24 will change within a data transition period commencing when the fastest local decoder 24 has its T and T̄ signals ready and ending when the slowest local decoder 24 has its T and T̄ signals ready.

The cell latch 26 must not be triggered during the data transition period as the signals T and T̄ are not known and stable at this time. Furthermore, in common with all types of clocked device, the cell latch 26 has a minimum setup time and a minimum hold time. Input data must be present and stable from at least the minimum setup time before the triggering clock edge until at least the minimum hold time after that edge for proper operation. In FIG. 5A, the actual setup and hold times are denoted $\Delta_3$ and $\Delta_2$ respectively.

The delay time $\Delta_1$ imposed on the DIGCLK signal by the delay element 28 is chosen to guarantee that the rising edge of the ANCLK signal occurs the minimum hold time before the data transition period in each cycle. The minimum hold time for most modern D-type latches is tending to 0, but it may be desirable to include some margin in $\Delta_2$. In other words, $$\Delta_1 = (t_{ckq} + t_{gd} + t_{ld}) - \Delta_2$$

Figure 5A:
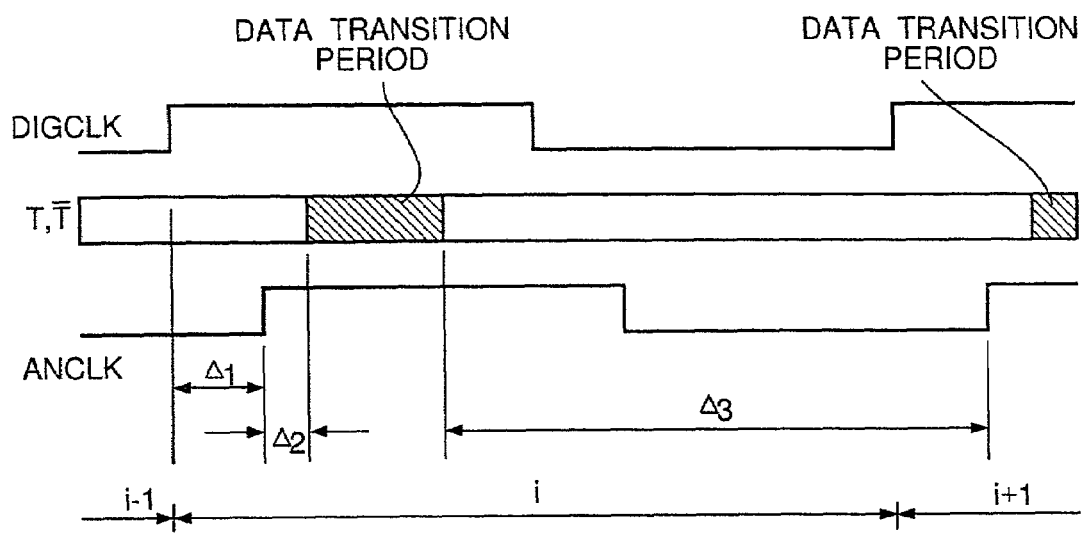
FIGS. 5A and 5B show respective timing diagrams for use in explaining operation of the FIG. 4 circuitry.
Figure 5B:
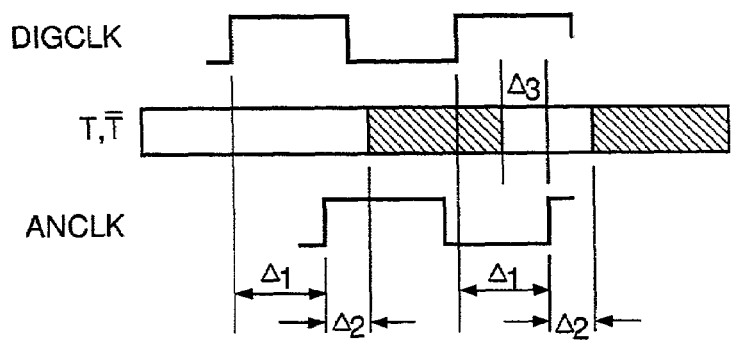

By delaying the ANCLK-signal rising edge in this way, the actual setup time $\Delta_3$ is increased by $\Delta_1$ (at the expense of the hold time) because, as is apparent from FIG. 5A, the T and T̄ signals produced in cycle i are not entered into the latch until the early part of the next cycle i+1.

It can be seen from FIG. 5A that the total cycle time (i.e. the period of the ANCLK signal or of the DIGCLK signal) is equal to $\Delta_2$+the data transition period+$\Delta_3$. Thus, it is possible to increase the clock rate (i.e. decrease the cycle time) by "squeezing" the setup time $\Delta_3$, as shown in FIG. 5B. This is possible because the setup time is also tending to 0 in modern D-type latches. The maximum clock rate is therefore only limited by the minimum setup time+the data transition period+the minimum hold time of the cell latch 26. In practice, with setup and hold times becoming smaller, the skew of the T and T̄ signals (i.e. the data transition period) is the practical limitation on clock rate.

Although the FIG. 4 circuitry is effective in achieving high clock rates, it has the disadvantage that, because the clock signal ANCLK for the second latch 26 is produced by delaying the DIGCLK signal, undesirable jitter is inevitably introduced into the TCK and T̄C̄K̄ signals by the cell latch 26. This jitter arises because the delay time $\Delta_1$ is not constant but varies in accordance with power supply fluctuations, noise and parasitic signals generated elsewhere in the circuitry, etc. The amount of jitter is essentially proportional to the magnitude of the delay time $\Delta_1$ which is, in turn, determined by the propagation times of the input latch 20 and the global and local decoders 22 and 24. Since $\Delta_1$ may be as large as several hundred picoseconds, the resulting jitter may be as large as 30 picoseconds.

A further disadvantage of the FIG. 4 circuitry is that the cell latch 26 is triggered whilst the global and local decoders are transitioning, further increasing jitter. This jitter may be significant, as every cell has a cell latch 26. In particular, the latch section of the circuitry has a full latch (the latch 26) per cell, drawing a large spike of current at every rising edge of the ANCLK signal, which will resonate with the bond wires of the power supplies for the latch section, increasing timing jitter.

Figure 6:
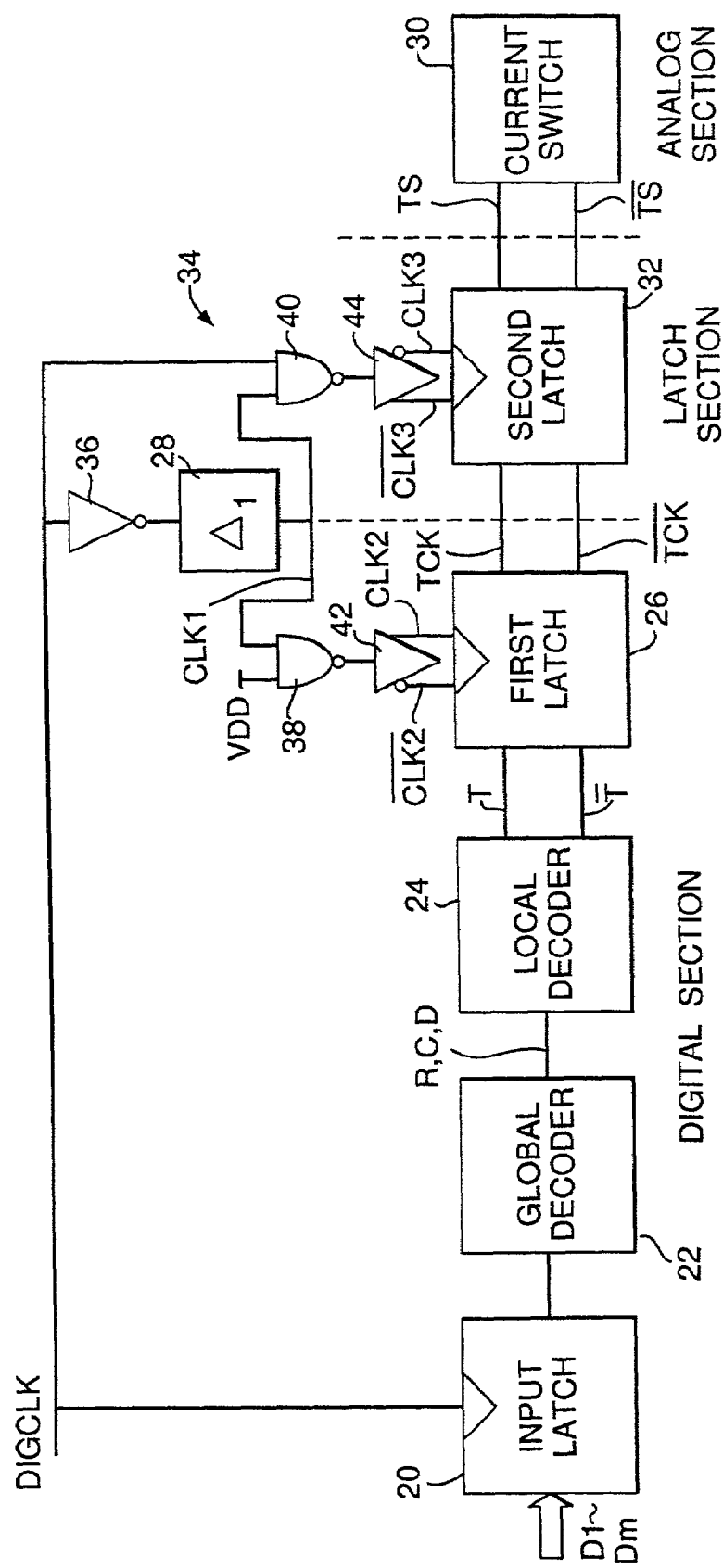
FIG. 6 shows parts of digital circuitry embodying the present invention.

FIG. 6 shows circuitry in accordance with a preferred embodiment of the present invention. In FIG. 6, elements which correspond to elements described previously with reference to FIG. 4 are denoted by the same reference numerals as in FIG. 4.

In FIG. 6, the digital section comprises, as in the FIG. 4 circuitry, the input latch 20, the global decoder 22 and the local decoder 24. However, the digital section in the FIG. 6 cell circuitry further comprises a first cell latch 26 which corresponds to the cell latch 26 in the latch section of the FIG. 4 circuitry. The first latch 26 in this embodiment has mutually-complementary clock inputs for receiving complementary clock signals CLK2 and C̄L̄K̄2̄. Mutually-complementary clocked thermometer-signals TCK and T̄C̄K̄ are delivered at the outputs of the first latch 26, as in the FIG. 4 circuitry.

The FIG. 6 circuitry has, in the latch section, a second cell latch 32 which is preferably a transparent half latch (although a full edge-triggered latch could be used instead). The second latch 32 has mutually-complementary inputs connected to the outputs of the first latch 26 for receiving the clocked thermometer signals TCK and T̄C̄K̄ therefrom.

The second latch 32 also has mutually-complementary clock inputs which are connected for receiving mutually-complementary clock signals CLK3 and C̄L̄K̄3̄. Mutually-complementary thermometer signals TS and T̄S̄ for application to a current switch 30 in the analog section are delivered at the outputs of the second latch 32. The second latch 32 is transparent when the clock signal CLK3 is at the high (H) logic level.

The FIG. 6 circuitry further comprises clock generating circuitry 34 for generating the clock signals CLK2/$\overline{\text{CLK2}}$ and CLK3/$\overline{\text{CLK3}}$. The clock generating circuitry 34 includes the delay element 28 of the FIG. 4 circuitry. The clock generating circuitry 34 further includes a first inverter 36, respective first and second NAND gates 38 and 40 and respective first and second drivers 42 and 44. Each of the drivers 42 and 44 is a buffer with mutually-complementary outputs.

The delay element 28 receives an externally-applied DIGCLK signal via the first inverter 36. Thus, at the output of the delay element 28 a delayed clock signal CLK1 is produced that is inverted and delayed by the delay time $\Delta_1$ relative to the externally-applied clock signal DIGCLK. This delayed clock signal CLK1 is delivered to one input of each of the NAND gates 38 and 40. The other input of the first NAND gate 38 is tied permanently to the high logic level H. The output of the first NAND gate 38 is received by the first driver 42 which buffers the output to produce the CLK2 signal and inverts the output to produce the $\overline{\text{CLK2}}$ signal.

The second input of the second NAND gate 40 is connected to receive the DIGCLK signal. The output of the second NAND gate 40 is received by the second driver 44 which produces the CLK3 signal by inverting that output and produces the $\overline{\text{CLK3}}$ signal by buffering that output (i.e. the opposite operation to that of the first driver 42).

Operation of the FIG. 6 circuitry will now be described with reference to FIGS. 7A and 7B which relate respectively to low-speed and high-speed clock rates.

Figure 7A:
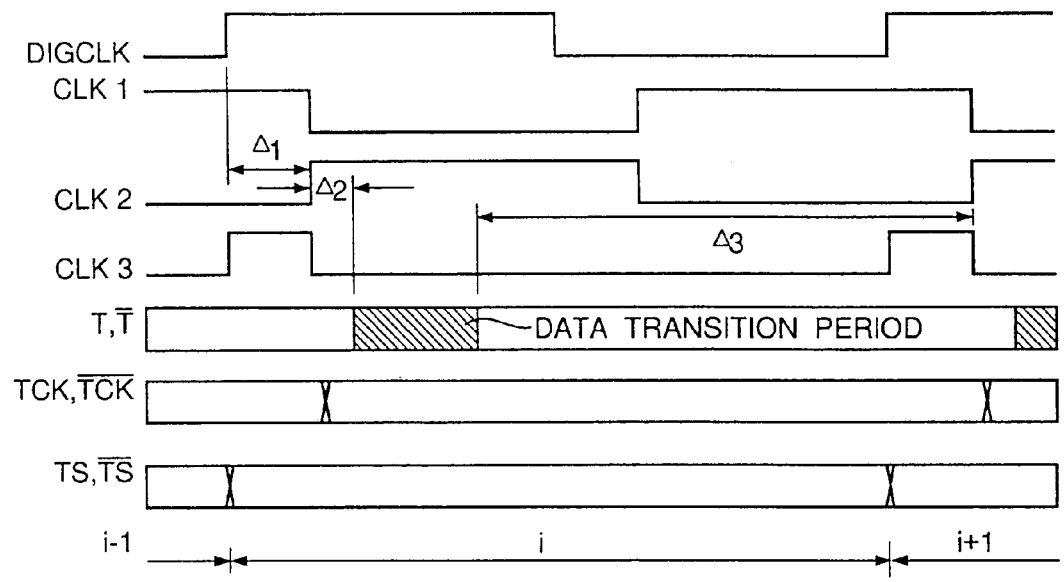
FIGS. 7A and 7B show respective timing diagrams for use in explaining operation of the FIG. 6 circuitry.
Figure 7B:
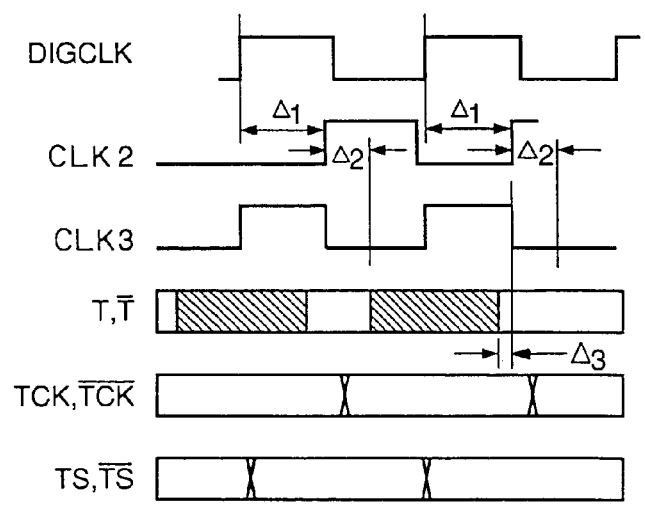

Referring firstly to FIG. 7A, the circuitry of FIG. 6 again operates in a pipeline manner, with successive cycles starting on each rising edge of the DIGCLK signal. As in the FIG. 4 circuitry, the respective propagation times $t_{ckq}$, $t_{gd}$ and $t_{ld}$ of the input latch 20, the global decoder 22 and the local decoder 24 combine to produce a delay before the outputs T and $\overline{\text{T}}$ of the local decoder 24 change in response to the acceptance (at the rising edge of DIGCLK) of a new input word D1~Dm for the cycle. Generally, there is a data transition period from the time at which the fastest cell produces valid T and $\overline{\text{T}}$ signals to the time at which the slowest cell produces such valid signals.

The first latch 26, now in the digital section, is triggered at the rising edge of the CLK2 signal in each cycle. Because the second input of the first NAND gate 38 is tied permanently to the H level, that gate simply functions as an inverter, so that CLK2 is an inverted version of the CLK1 signal. Thus, referring back to FIG. 5A, the CLK2 signal simply corresponds to the ANCLK signal in the FIG. 4 circuitry. Thus, as in the FIG. 4 circuitry, the outputs TCK and $\overline{\text{TCK}}$ of the first latch 26 do not change until a time $\Delta_1$ after the start of the next cycle after the cycle in which the new input word was accepted. Thus, in FIG. 7A, the transition in cycle i of the TCK and $\overline{\text{TCK}}$ signals represents the result of processing the input word accepted at the beginning of the preceding cycle i−1.

The second latch 32 is controlled by the clock signals CLK3 and $\overline{\text{CLK3}}$ applied thereto by the second driver 44. The CLK3 signal becomes H when the DIGCLK and CLK1 signals are both high simultaneously. This occurs for the period $\Delta_1$ at the beginning of each cycle. Accordingly, the second latch 32 is transparent for this period $\Delta_1$ at the start of each cycle, and is in the non-transparent (holding) state for the remainder of the cycle.

As is apparent from FIG. 7A, the second latch 32 is no longer transparent in each cycle by the time that the outputs TCK and $\overline{\text{TCK}}$ of the first latch 26 undergo their transitions. Accordingly, these transitions are not registered by the latch 32 until the beginning of the following cycle when CLK3 rises. This means that the new input word accepted in cycle i−1 does not cause the outputs TS and $\overline{\text{TS}}$ of the second latch to change until the start of the next-but-one cycle i+1.

In the FIG. 6 circuitry, the outputs TCK and $\overline{\text{TCK}}$ of the first latch 26 are subject to jitter arising from operation of the delay element 28 in exactly the same way as in the FIG. 4 circuitry. However, this jitter does not affect the outputs TS and $\overline{\text{TS}}$ of the second latch 32, for reasons that will now be explained. The second latch 32 becomes transparent on the rising edge of the CLK3 signal. The time that this signal rises is determined not by the operation of the delay element 28 but by the rise of the DIGCLK signal for each cell. Only the time at which the CLK3 signal falls is determined by the delayed clock signal CLK1 produced by the delay element 28. It therefore follows that there is no or no significant jitter on the rising edge of CLK3.

There is jitter on the rising edge of CLK2 and this inevitably produces jitter in the input signals TCK and $\overline{\text{TCK}}$ of the second latch 32. However, this jitter is of no consequence because the second latch 32 is placed in the holding state before the signals TCK and $\overline{\text{TCK}}$ undergo their transitions. Thus, the jitter in these signals does not feed through to the TS and $\overline{\text{TS}}$ signals. By the time the second latch 32 is made transparent again (at the beginning of the next cycle) the TCK and $\overline{\text{TCK}}$ signals have long settled and so are stable at the moment the second latch 32 is made transparent. No jitter occurs at this time because the TCK and $\overline{\text{TCK}}$ signals are fixed whilst CLK2 remains low.

In the FIG. 6 circuitry, $\Delta_1$ is determined as in the FIG. 4 circuitry to provide sufficient hold time $\Delta_2$ for the first latch 26 taking into account the propagation times of the elements 20, 22 and 24 preceding it in the digital section. The cycle time is thus equal to the hold time $\Delta_2$+the data transition period+the setup time $\Delta_3$. As shown in FIG. 7B, the setup time $\Delta_3$ can be reduced when the DIGCLK rate is increased, the maximum clock rate being determined by the sum of the minimum setup and hold times of the first latch 26 and the data transition period. The minimum setup time may be of the order of 100 to 200 picoseconds and the minimum hold time is 0 or possibly even negative. The data transition period may be of the order of 300 to 400 picoseconds, suggesting that a maximum clock rate of 2.5 GHz is possible, although in practice other circuit limitations are likely to restrict the maximum clock rate to around 1 GHz.

Thus, compared with the FIG. 4 circuitry, it can be seen that the same speed performance is obtained but with a jitter performance as good as if the delay element 28 were not present at all.

It will be appreciated in the FIG. 6 circuitry that the first NAND gate 38 and the first driver 42 have the same construction as the second NAND gate 40 and the second driver 44. Accordingly, the combined propagation time of the first NAND gate 38 and the first driver 42 is substantially equal to the combined propagation time of the second NAND gate 40 and the second driver 44. This ensures that the delay in the clock path between the delay element 28 and the first latch 26 is substantially in balance with the delay in the clock path between the delay element 28 and the second latch 32. This in turn ensures that the second latch is reliably in the holding state by the time the first latch undergoes its output transitions.

In the FIG. 6 circuitry, the second latch 26 is transparent whilst the global and local decoders 22 and 24 are transitioning, but is non-transparent when the output of the first latch 26 is transitioning. In this way, no current flows from the digital-section power supply to the latch-section power supply when the output of the first latch transitions, other than parasitic currents from the global and local decoders 22 and 24. In the FIG. 4 circuitry, in comparison, the input stage of the cell latch 26 was transparent during the local decoder transitions, causing currents to flow between the digital section and latch section power supplies, and inevitably causing clock jitter. In the FIG. 6 circuitry, during the transparent phase of the second latch 32, any parasitic currents flowing from the digital section have a direct path to the analog section. However, during this period there are no transitions of the first latch 26, and the second latch can be adapted to attenuate any parasitic currents (as explained below with reference to FIG. 8) before such parasitic currents get onto the power supply of the analog section.

Figure 8:
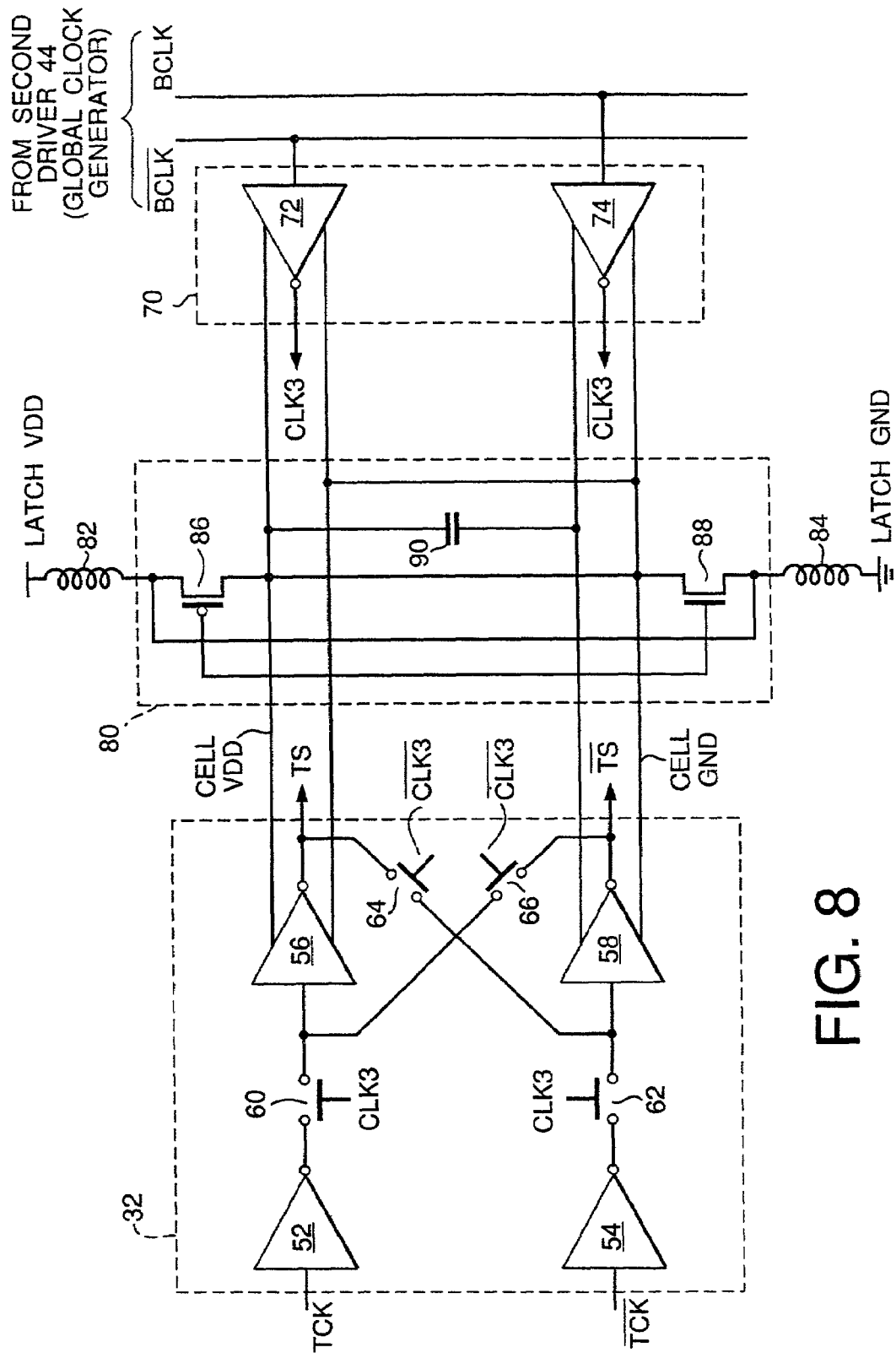
FIG. 8 shows in more detail than FIG. 6 parts of a latch section of the FIG. 6 digital circuitry.

FIG. 8 shows in more detail parts of the FIG. 6 circuitry in the latch section.

The second latch 32 comprises a first pair of inverters 52 and 54 connected respectively to receive the clocked thermometer signals TCK and $\overline{TCK}$ from the digital section, and a second pair of inverters 56 and 58 connected respectively to the outputs of the inverters 52 and 54 of the first pair via respective electronic switches (transfer gates) 60 and 62.

The output of each of the inverters 56 and 58 of the second pair is cross-coupled via a further electronic switch 64 or 66 to the input of the other inverter 58 or 56 of the second pair. The outputs of the second-pair inverters 56 an 58 provide respectively the thermometer signals TS and $\overline{TS}$ for application to the current switch 30 in the analog section.

The switches 60, 62, 64 and 66 are controlled by the signals CLK3 and $\overline{CLK3}$ produced by the second driver 44. The switches 60 and 62 between the first pair of inverters and the second pair of inverters are conductive when the CLK3 signal has the high level and are otherwise non-conductive. The switches 64 and 66 cross-coupling the inverters 56 and 58 of the second pair are conductive when the $\overline{CLK3}$ signal is at the high level and are non-conductive otherwise.

In the FIG. 8 embodiment, the second driver 44 shown in FIG. 6 is connected to the latch-section circuitry of the particular cell via a local clock buffer 70 which comprises respective inverters 72 and 74. The inverter 72 receives an inverted basic clock signal $\overline{BCLK}$ produced by the second driver 44 and inverts it to produce the CLK3 signal. The inverter 74 receives a non-inverted basic clock signal BCLK from the second driver 44 and inverts it to produce the $\overline{CLK3}$ signal. The BCLK and $\overline{BCLK}$ signals produced by the second driver 44 constitute mutually-complementary basic clock signals supplied in common to all of the cells of the DAC. Thus, the clock generating circuitry 34 in FIG. 6 serves as a global clock generator for supplying the basic clock signals in common to all cells. The local clock buffer 70 in each cell receives the basic clock signals and buffers them to produce mutually-complementary local clock signals CLK3 and $\overline{CLK3}$ for its particular cell. The use of such a local clock buffer is a further measure to reduce jitter on the CLK3 and $\overline{CLK3}$ clock signals, as described in more detail in our co-pending United Kingdom Patent Application No. 9804587.5.

Incidentally, although not shown in FIG. 8, in this embodiment a further local clock buffer, of the same construction as the clock buffer 70, is provided between the first driver 42 (part of the global clock generator) and the first latch 26 of each cell. This balances the respective delays in the two clock paths between the delay element 28 and the first and second latches 26 and 32 respectively.

A further measure taken in the FIG. 8 latch-section circuitry for an individual cell is to provide a power supply decoupling circuit 80 that is connected via respective bond wires 82 and 84 (shown schematically as inductors) to the latch section positive supply (LATCH VDD) and the latch-section ground (LATCH GND). The power supply decoupling circuit 80 comprises a P-type transistor 86 connected between the positive bond wire 82 and an internal power supply line CELL VDD of the cell. The gate of this P-type transistor 86 is connected to the negative bond wire 84 so as to be maintained permanently at the LATCH GND potential.

The power supply decoupling circuit 80 further comprises an N-type transistor 88 connected between the negative bond wire 84 and an internal ground supply line CELL GND of the cell. The gate of the N-type transistor 88 is connected to the positive bond wire 82 so that it is maintained permanently at the LATCH VDD potential. A capacitor 90 is connected between the internal power supply lines CELL VDD and CELL GND.

The inverters 56 and 58 in the second latch 32 and the inverters 72 and 74 in the second driver 44 are powered by the internal power supply lines CELL VDD and CELL GND. The inverters 52 and 54 in the second latch 32 are powered from DIGITAL VDD and DIGITAL GND directly.

Operation of the FIG. 8 latch-section circuitry will now be described. The transistors 86 and 88 in the power supply decoupling circuit 80 are maintained in the ON condition permanently and serve as respective resistance elements whose resistance varies in accordance with power supply fluctuations. Operation of the power supply decoupling circuit 80 is described in more detail in our co-pending United Kingdom Patent Application No. 9804587.5.

As mentioned previously, the second latch 32 has a transparent phase and a holding phase. In the transparent phase, the clock signals CLK3 and $\overline{CLK3}$ are high level and low level respectively. In this state, the switches 60 and 62 are turned on so that the output signals TS and $\overline{TS}$ follow the input signals TCK and $\overline{TCK}$ respectively. At the end of the transparent phase, the clock signals CLK3 and $\overline{CLK3}$ change to low level and high level respectively. At this time, the switches 60 an 62 turn off and the switches 64 and 66 turn on. At this time, the outputs of the inverters 56 and 58 are locked in whatever state they were in when the switches 60 and 62 turned off.

It will be appreciated that, because in the FIG. 8 circuit the second latch 32 can be implemented as a half latch, the number of transistors supplied by the latch-section power supply is approximately halved compared to the FIG. 4 circuitry in which a full latch was employed, reducing the currents injected into the latch-section power supply. The use of such a half latch is possible because the first latch 26 in the digital section does not change its outputs during the transparent phase. As mentioned previously, during the transparent phase any parasitic currents flowing from the digital section have a direct path to the analog section. Any such parasitic current will, however, be attenuated by the first pair of inverters 52 and 54 in the third latch, preventing them from reaching the analog section 30.

A number of variations are possible on the embodiment described above with reference to FIGS. 6 to 8. Each of the first, second and input latches can be of the transparent type as opposed to being of the edge-triggered type. It is also not necessary that any edge-triggered latch be triggered on the positive edge. A mixture of positive and negative edge-triggered devices can be employed. Furthermore, any suitable designs of half latch (clocked flip-flop such as SR-type) or full latch (D-type flip-flop or JK flip-flop) can be used. The full latches can be of the master-slave type.

It is also not essential for the power supply decoupling circuit 80 to be provided for each cell. Nor is it necessary for there to be a local clock buffer in each cell. The second driver 44 could be connected in common to all cells.

Although FIG. 6 shows latch elements 26 and 32 in the digital circuitry connected to the analog circuitry, this is not essential. Any type of clocked element can be used so long as it is capable of receiving at least one digital signal and outputting at least one digital signal derived from the received digital signal(s) such that the timing of application of the output digital signal(s) to the next stage is controlled by a clock signal. The received and output digital signals need not be equal in number. For example, the clocked element could have a combinatorial logic function for combining two or more received digital signals to produce one output digital signal. Nor need it necessarily be the case that the final digital signals in the different cells be applied simultaneously to the different analog-circuitry inputs. In some situations a staggered application of the final digital signals might be required, the times when the different final digital signals are applied to their respective inputs nonetheless requiring careful control.

Figure 9:
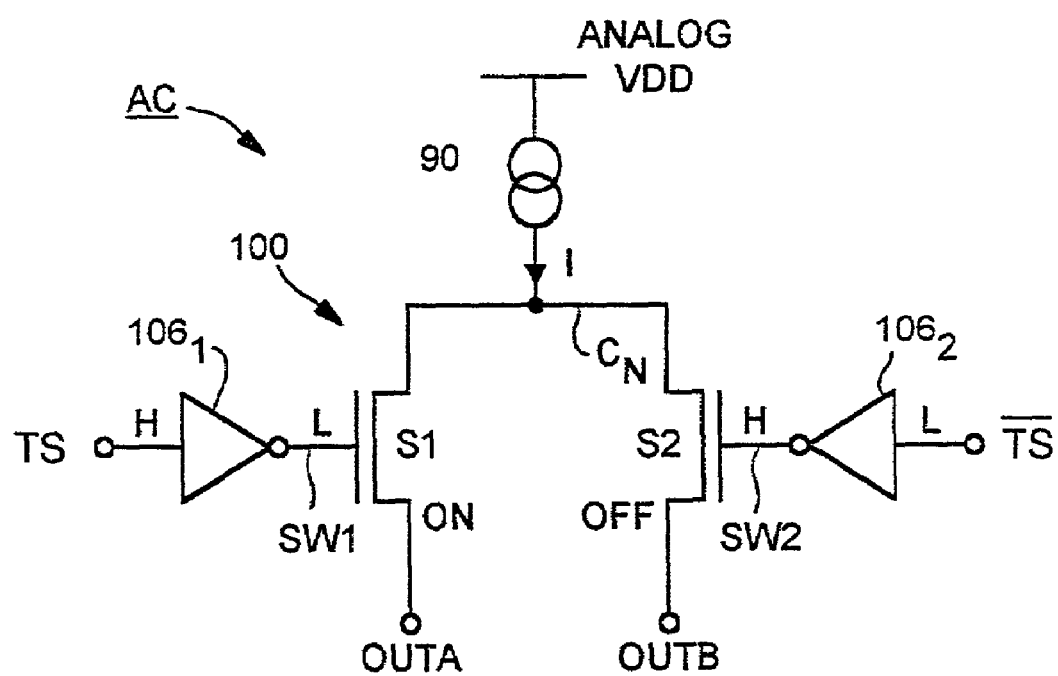
FIG. 9 shows a circuit diagram of an analog circuit suitable for use in a DAC IC embodying the present invention.

FIG. 9 shows parts of an exemplary analog circuit AC of one cell of the FIG. 3 circuitry. The analog circuit AC comprises a constant-current source 90 and a differential switching circuit 100. The differential switching circuit 100 comprises first and second PMOS field-effect-transistors (FETs) S1 and S2. The respective sources of the transistors S1 and S2 are connected to a common node CN to which the current source 90 is also connected. The respective drains of the transistors S1 and S2 are connected to respective first and second summing output terminals OUTA and OUTB of the circuit. In this embodiment, the output terminals OUTA of all cells are connected together and the respective output terminals OUTB of the cells are connected together.

Figures 1, 2:
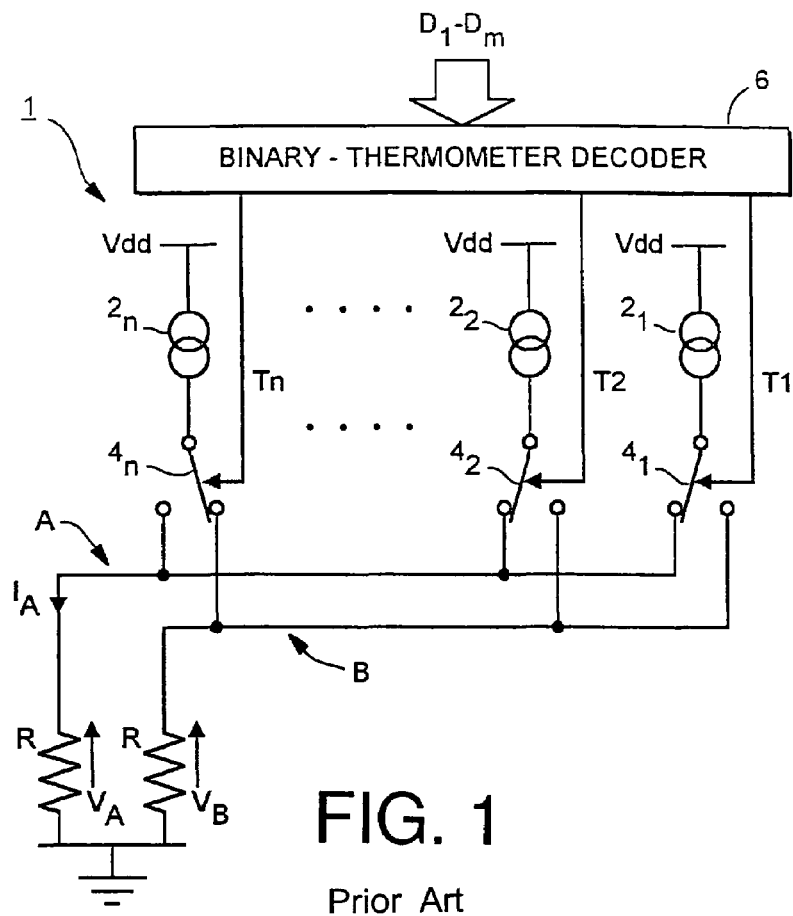
FIG. 1, discussed hereinbefore, shows parts of a conventional DAC IC.
FIG. 2, also discussed hereinbefore, presents a table showing thermometer-coded signals derived from a binary input word.

Each transistor S1 and S2 has a corresponding driver circuit 106$_1$ and 106$_2$ connected to its gate. The thermometer signals TS and $\overline{TS}$ produced by the second latch 32 of the cell (FIG. 6) are applied respectively to inputs of the driver circuits 106$_1$ and 106$_2$. Each driver circuit buffers and inverts its received input signal TS or $\overline{TS}$ to produce a switching signal SW1 or SW2 for its associated transistor S1 or S2 such that, in the steady-state condition, one of the transistors S1 and S2 is on and the other is off. For example, as indicated in FIG. 2 itself, when the input signal TS has the high level (H) and the input signal $\overline{TS}$ as the low level (L), the switching signal SW1 (gate drive voltage) for the transistor S1 is at the low level L causing that transistor be ON, whereas the switching signal SW2 (gate drive voltage) for the transistor S2 is at the high level H, causing that transistor to be OFF. Thus, in this condition, all of the current I flowing into the common node CN is passed to the first output terminal OUTA and no current passes to the second output terminal OUTB.

When the input signals TS and $\overline{TS}$ undergo complementary changes from the state shown in FIG. 9, the transistor S1 turns OFF at the same time that the transistor S2 turns ON.

It will be appreciated that many other designs of analog circuit can be used. For example, other differential switching circuits are described in our copending United Kingdom Patent Application No. 9800387.4, and other cell arrays for use in DAC ICs and other mixed-signal ICs are described in our copending United Kingdom patent application no. 9800367.6.

It is not necessary to use two clock distribution lines to distribute mutually-complementary basic clock signals BCLK and $\overline{BCLK}$ to the buffer circuits; a single clock distribution line can be used. However, the use of two clock distribution lines has the advantage that the clock distribution lines undergo complementary changes so that the substrate (to which the two clock distribution lines are capacitively coupled) is affected less by clock-signal changes.

It will be understood by those skilled in the art that it is not necessary for the second latch 32 in every cell to be provided with its own buffer circuit 70 as in FIG. 8. For example, it would be possible for two or more second latches (e.g. the second latches in adjacent cells) to share the same buffer circuit 70, enabling the total number of buffer circuits to be reduced. In this case, however, some data-dependent jitter will inevitably remain. For example, there will be some input-word changes which result in the second latches in both the adjacent cells changing state (high loading), and other input-word changes for which only one or none of them changes state (medium or low loading). Because of these different loading possibilities amongst latches that share a common buffer circuit, jitter will exist.

It is not necessary for the different cells to have respective clock buffer circuits. It is also not necessary to provide each cell with its own individual power supply decoupling circuit 80 for the second latch 32 and clock buffer 70 of the cell. Several cells could share the same power supply decoupling circuit, or the power supply decoupling circuits could be omitted altogether. When two or more cells share the same clock buffer circuit (a further possibility mentioned above) a unit for power supply purposes could be formed by the second latches 32 of those two or more cells together with the common buffer circuit which applies clock signals to those latches.

It is not essential in any of the foregoing embodiments that the digital circuitry (10 in FIG. 3) produces thermometer-coded signals. The analog circuits could, for example, be selected individually in accordance with the digital signals produced by the digital circuitry, rather than combinatorially as in the case in which thermometer-coded signals are used. Thus, the digital signals produced by the digital circuitry could be mutually-exclusive selection signals.

It is not essential to supply power independently to the different circuitry sections (digital, latch and analog). A common power supply can be used for all sections, if desired.

The measures described in relation to the foregoing embodiments are applicable in any situation in which a timing-sensitive circuit (particularly an analog circuit) must be capable of undergoing a predetermined operation at a well-defined instant in time. When plural such timing-sensitive circuits are required, the foregoing embodiments can enable them to undergo respective predetermined operations at a single well-defined instant in time or even at respective staggered (but well-defined) instants in time.

What is claimed is:

1. A digital circuitry, operative repetitively to perform a series of processing cycles, comprising:
   an input signal processing circuit performing, in each cycle, a predetermined processing operation on one or more input signal(s) received by the digital circuitry to derive therefrom one or more first signal(s), said predetermined processing operation being commenced in response to a first clock signal;

a first clocked element receiving said one or more first signal(s) and a second clock signal, and producing one or more second signal(s), said first clocked element being switchable by said second clock signal between a first responsive state, in which the first clocked element changes said one or more second signal(s) in response to a change in said one or more first signal(s), and a first non-responsive state in which no change in said one or more second signal(s) occurs;

a second clocked element receiving said one or more second signal(s) and a third clock signal, and producing one or more output signal(s) of said digital circuitry, said second clocked element being switchable by said third clock signal between a second responsive state, in which the second clocked element changes said one or more output signal(s) in response to a change in said one or more second signal(s), and a second non-responsive state in which no change in said one or more output signal(s) occurs; and a clock generating circuitry generating the second and third clock signals from the first clock signal, the second clock signal being delayed relative to the first clock signal by a preselected delay time and said third clock signal being delayed relative to the first clock signal by less than said preselected delay time such that in each cycle the first clocked element enters said first non-responsive state before the end of said predetermined processing operation, and said second clocked element enters said second responsive state when the first clocked element is in said first non-responsive state.

2. The digital circuitry as claimed in claim 1, wherein said third dock signal has no substantial delay relative to said first clock signal.

3. The digital circuitry as claimed in claim 1, wherein said preselected delay time is chosen such that said first docked element enters said first non-responsive state at least a predetermined hold time before the end of said predetermined processing operation, which the predetermined hold time is the minimum period for which the one or more first signal(s) must remain stable after the first clocked element enters said first non-responsive state.

4. The digital circuitry as claimed in claim 1, wherein a predetermined enabling change in said third clock signal enabling the second clocked element to change from said second non-responsive state to said second responsive state, and said predetermined enabling change occurs substantially simultaneously with a first change in said first clock signal.

5. The digital circuitry as claimed in claim 4, wherein said first change in the first clock signal is a predetermined enabling change enabling in said first clock signal said predetermined processing operation to commence.

6. The digital circuitry as claimed in claim 4, wherein a predetermined disabling change in the third clock signal, enabling the second clocked element to change from said second responsive state to said second non-responsive state, is delayed relative to a second change in the first clock signal.

7. The digital circuitry as claimed in claim 6, wherein the clock generating circuitry comprises:

a delay element delaying the first clock signal to produce a delayed version thereof; and a logic element logically combining the first clock signal with the delayed version thereof such that said predetermined enabling change in the third clock signal occurs substantially simultaneously with said predetermined enabling change in said first clock signal, and said predetermined disabling change in the third clock signal occurs substantially simultaneously with a change in said delayed version of the first clock signal.

8. The digital circuitry as claimed in claim 7, wherein said clock generating circuitry further comprises:

a delay balancing element connected between said delay element and said first clocked element receiving said delayed version of the first clock signal and deriving therefrom said second clock signal;

the delay balancing element having a first propagation delay between said change in the delayed version of the first clock signal and a predetermined enabling change in said second clock signal that causes the first clocked element to change from said first non-responsive state to sold first responsive state;

said logic element having a second propagation delay between said change in said delayed version of the first clock signal and said disabling change in the third clock signal; and said first propagation delay being substantially equal to said second propagation delay.

9. The digital circuitry as claimed in claim 1, wherein said input signal processing circuit comprising:

a third clocked element receiving said one or more input signal(s) end said first clock signal, and producing one or more basic clock signal(s), said third clocked element being switchable by said first clock signal between a third responsive state, in which said third clocked element changes said one or more basic clock signal(s) in response to a change in said one or more input signal(s), and a third non-responsive state in which no change in said one or more basic clock signal(s) occurs; and a signal processing circuitry processing said one or more first signal(s) from said one or more changed basic clock signal(s) and said one or more basic clock signal(s).

10. The digital circuitry as claimed in claim 1, wherein said first clocked element comprises a D-type latch element.

11. The digital circuitry as claimed in claim 1, wherein said second clocked element comprises a transparent half-latch element.

12. The digital circuitry as claimed in claim 1; at least one of said one or more first signal(s) and said one or more second signal(s), or said one or more first signal(s) and said one or more output signal(s), or said one or more second signal(s) and said one or more output signal(s) is a complementary signal pair.

13. The digital circuitry as claimed in claim 1, wherein the at least one of the said one or more first signal(s), or said one or more second signal(s), or said one or more output signal(s) is a thermometer-coded signal.

14. The digital circuitry as claimed in claim 1, further including power supply circuitry supplying power to said second clocked element independently from that supplied to at least another part of said digital circuitry.

15. A digital circuitry, operative repetitively to perform a series of processing cycles, comprising:

a plurality of individual circuit units, each circuit unit comprising:

an input signal processing circuit performing, in each cycle, a predetermined processing operation on one or more input signal(s) received by the digital circuitry to derive therefrom one or more first signal(s), said predetermined processing operation being commenced in response to a first clock signal, a first clocked element receiving said one or more first signal(s) and a second clock signal, and producing one or more second signal(s), said first docked element being switchable by said second clock signal between a first responsive state, in which the first clocked element changes said one or mote second signal(s) in response to a change in said one or more first signal(s), and a first non-responsive state in which no change in said one or more second signal(s) occurs, a second clocked element receiving said one or more second signal(s) and a third clock signal, and producing one or more output signal(s) of said digital circuitry, said second clocked element being switchable by said third clock signal between a second responsive state, in which the second clocked element changes said one or more output signal(s) in response to a change in said one or more second signal(s), and a second non-responsive state in which no change in said one or more output signal(s) occur, and a clock generating circuitry generating the second and third clock signals from the first clock signal, the second clock signal being delayed relative to the first clock signal by a preselected delay time and said third clock signal being delayed relative to the first clock signal by less than said preselected delay time such that in each cycle the first clocked element enters said first non-responsive state before the end of said predetermined processing operation, and said second clocked element enters said second responsive state when the first clocked element is in said first non-responsive state.

16. The digital circuitry as claimed in claim 15, wherein the clock generating circuitry comprises:

a global clock generator provided in common for all said individual circuit units and operable to produce a basic clock signal; and a plurality of local clock drivers, each of said local clock drivers corresponding to one or more of said circuit unit(s), and each said local clock driver being connected to the global clock generator for receiving therefrom said basic clock signal and being operable to derive therefrom said third clock signal for application to said second clocked circuit in each of its said one or more corresponding individual circuit unit(s).

17. The digital circuitry as claimed in claim 16, wherein each of said individual circuit units has its own individually-corresponding one of said local clock drivers.

18. The digital circuitry as claimed in claim 17, having at least two power supplies for the plurality of individual circuit units, each power supply corresponding to one or more of said circuit unit(s) and supplying power to a predetermined part of its said one or more corresponding circuit unit(s), said digital circuitry further comprising:

a power supply decoupling circuit decouplings said at least two power supplies from one another;

wherein said predetermined part of said circuit unit(s) includes said second clocked element and said local clock driver of each of said individual circuit units.

19. The digital circuitry as claimed in claim 16, wherein said global clock generator is operable to produce said basic clock signal and a complementary basic clock signal, wherein both said basic clock signal and said complementary basic clock signal are applied in common to all of said plurality of local clock drivers.

20. The digital circuitry as claimed in claim 15, having at least two power supplies for the plurality of individual circuit units, each said power supplies corresponding to one or more of said circuit unit(s) and supplying power to a predetermined part of its said one or more corresponding circuit unit(s), said digital circuitry further comprising a power supply decoupling circuit decoupling said at least two power supplies from one another.

21. The digital circuitry as claimed in claim 20, wherein each of said circuit units has its own individually-corresponding one of said at least two power supplies, and said power supply decoupling circuit decouples the power supply of said predetermined part of said one or more corresponding circuit unit(s) from that of each other one of the one or more corresponding circuit unit(s).

22. The digital circuitry as claimed in claim 20, wherein said predetermined part of said one or more corresponding circuit unit(s), includes said second clocked element.

23. A mixed-signal circuitry, including:

a digital circuitry, operative repetitively to perform a series of processing cycles, comprising:

an input signal processing circuit performing, in each cycle, a predetermined processing operation on one or more input signal(s) received by the digital circuitry to derive therefrom one or more first signal(s), said predetermined processing operation being commenced in response to a first clock signal, a first clocked element receiving said one or more first signal(s) and a second clock signal, and producing one or more second signal(s), said first clocked element being switchable by said second dock signal between a first responsive state, in which the first clocked element changes said one or more second signal(s) in response to a change in said one or more first signal(s), end a first non-responsive state in which no change in said one or more second signal(s) occurs, a second clocked element receiving said one or more second signal(s) and a third clock signal, and producing one or more output signal(s) of said digital circuitry, said second clocked element being switchable by said third clock signal between a second responsive state, in which the second clocked element changes said one or more output signal(s) in response to a change in said one or more second signal(s) to change the one or more output signal(s) of said digital circuitry, and a second non-responsive state in which no change in said one or more output signal(s) occurs, and a clock generating circuitry generating the second and third clock signals from the first clock signal, the second clock signal being delayed relative to the first clock signal by a preselected delay time and said third clock signal being delayed relative to the first clock signal by less than said preselected delay time such that in each cycle the first clocked element enters said first non-responsive state before the end of said predetermined processing operation, and said second clocked element enters said second responsive state when the first clocked element is in said first non-responsive state; and an analog circuitry connected to said digital circuitry for receiving therefrom said one or more output signal(s) and operable to produce one or more analog signal(s) in dependence upon the received one or more output signal(s).

24. The mixed-signal circuitry as claimed in claim 23, including a digital-to-analog converter as a part of the analogy circuitry to produce the one or more analog signal(s).

25. The mixed-signal circuitry as claimed in claim 23, wherein the analog circuitry further comprises:
a plurality of current sources or current sinks sourcing or sinking respective currents, and a plurality of switch circuits, connected to the plurality of current sources or current sinks switching said currents selectively in dependence upon the received one or more output signal(s) so as to produce said one or more analog signal(s).

26. The mixed-signal circuitry as claimed in claim 23, wherein said digital circuitry further comprises:
a power supply circuitry supplying power to a first part of said digital circuitry independently from that supplied to a second part of said digital circuitry,
wherein said first part of said digital circuitry is the second clocked element, said second part of said digital circuitry is at least one of said input signal processing circuit, said first clocked element, and said clock generating circuitry, and wherein said power supply circuitry also supplies power to said analog circuitry independently of said power supplied to the first part of said digital circuitry and to said second part of the digital circuitry.

27. A digital-analog converter circuit, comprising:
a digital circuit to perform a series of processing cycles, comprising:
an input signal processing circuit clocked by a first clock signal, inputting one or more first signal(s), performing a predetermined processing operation of the one or more first signal(s), and outputting a first output signal,
a first latch circuit clocked by a second clock signal, inputting the first output signal, and outputting a second output signal,
a second latch circuit clocked by a third clock signal, and inputting the second output signal from the first latch circuit, and
a clock generating circuit generating the second and the third clock signals from the first clock signal,
the second clock signal being delayed relative to the first clock signal by a predetermined delay time, and a rising edge of the third clock signal edge occurring at substantially the same time as a rising edge of the first clock signal and a falling edge of the third clock signal occurring at substantially the same time as a rising edge of the second clock signal; and
an analog circuit connected to said digital circuit receiving therefrom one or more output signal(s) and operable to produce one or more analog signal(s) in dependence upon said one or more output signal(s).

28. The digital-analog converter circuit as claimed in claim 27, wherein the clock generating circuit comprises:
a delay element delaying the first clock signal to produce a delayed version thereof, and
a logic element logically combining the first clock signal with the delayed version thereof such that an enabling change in the third dock signal occurs substantially simultaneously with an enabling change in the first clock signal, and a disabling change in the third clock signal occurs substantially simultaneously with a change in the delayed version of the first clock signal.

29. The digital-analog converter circuit as claimed in claim 28, wherein said clock generating circuit further comprises:
a delay balancing element connected between said delay element and said first clocked element receiving said delayed version of the first clock signal and deriving therefrom said second clock signal,
the delay balancing element having a first propagation delay between said change in the delayed version of the first clock signal and a predetermined enabling change in said second clock signal causing the first clocked element to change from a first non-responsive state to a first responsive state,
said logic element having a second propagation delay between said change in the delayed version of the first clock signal and said disabling change in the third clock signal, and
said first propagation delay being substantially equal to said second propagation delay.

30. A digital-analog converter circuit, comprising:
a digital circuit to perform a series of processing cycles, comprising:
an input signal processing circuit clocked by a first clock signal, inputting one or more first signal(s), and performing a predetermined processing operation on the one or more first signal(s), and outputting a first output signal,
a first latch circuit clocked by a second clock signal and inputting the first output signal,
a second latch circuit clocked by a third clock signal and inputting an output signal from the first latch circuit, and
a clock generating circuit generating the second and third clock signals from the first clock signal, the second clock signal being delayed relative to the first clock signal by a predetermined delay time, a rising edge of the third clock signal without a substantial delay time relative to a rising edge of the first clock signal or with a shorter delay time than the delay time of the second clock signal and making the second latch circuit enter a responsive state during a non-responsive state of the first latch circuit; and
an analog circuit connected to said digital circuit receiving therefrom one or more output signal(s) to produce one or more analog signal(s) in dependence upon said one or more output signal(s) received from the digital circuit.

31. The digital-analog converter circuit as claimed in claim 30, wherein the clock generating circuit comprises:
a delay element delaying the first clock signal to produce a delayed version thereof, and
a logic element logically combining the first clock signal with the delayed version thereof such that an enabling change in the third clock signal occurs substantially simultaneously with an enabling change in the first clock signal, and a disabling change in the third clock signal is substantially simultaneous with a change in the delayed version of the first clock signal.

32. The digital-analog converter circuit as claimed in claim 31, wherein said clock generating circuit further comprises:
a delay balancing element connected between said delay element and said first latch element for receiving said delayed version of the first clock signal and for deriving therefrom said second clock signal,
the delay balancing element having a first propagation delay between said change in the delayed version of the first clock signal and a predetermined enabling change in said second clock signal that causes the first clocked element to change from the first non-responsive state to the first responsive state, said logic element having a second propagation delay between said change in the delayed version of the first clock signal and said disabling change in the third clock signal, and said first propagation delay being substantially equal to said second propagation delay.

33. A digital-analog converter circuit, comprising:

a digital circuit performing a series of processing cycles, comprising:

a digital input circuit receiving a plurality of digital signals in response to a first clock signal, a delay element receiving the first clock signal and outputting a delayed clock signal, a clock generating circuit receiving the first clock signal and generating a second clock signal, produced from the delayed clock signal, and a third clock signal, produced from the first clock signal and the delayed clock signal, a first latch circuit, coupled to the digital input circuit, receiving an output signal from the digital input circuit in response to the second clock signal, and a second latch circuit, coupled to the first latch circuit, receiving an output signal from the first latch circuit in response to the third clock signal; and an analog circuit connected to said digital circuit, receiving therefrom one or more output signal(s), and producing one or more analog signal(s) in dependence upon the received one or more output signal(s) from the digital circuit.

34. A digital-analog converter circuit comprising:

a digital circuit to perform a series of processing cycles, comprising:

an input signal processing circuit clocked by a first clock signal, inputting one or more first signal(s), and performing a predetermined processing operation on the first signal(s), and outputting a first output signal;

a clock generating circuit generating second and third clock signals from the first clock signal, the second clock signal being delayed relative to the first clock signal by a first preselected delay time and the third clock signal being delayed relative to the first clock signal by a second preselected delay time;

a first latch circuit being switchably clocked by the second clock signal;

a second latch circuit clocked by the third clock signal, wherein the first latch circuit and the second latch circuit operate between a responsive state and a non-responsive state by turns; and an analog circuit connected to said digital circuit receiving therefrom one or more output signal(s) to produce one or more analog signal(s) in dependence upon one or more output signal(s) from the digital circuit.

* * * * *

UNITED STATES PATENT AND TRADEMARK OFFICE
CERTIFICATE OF CORRECTION

PATENT NO. : 7,065,168 B2  Page 1 of 1
APPLICATION NO. : 09/382459
DATED : June 20, 2006
INVENTOR(S) : Ian Juso Dedic et al.

It is certified that error appears in the above-identified patent and that said Letters Patent is hereby corrected as shown below:

On Title page item 57 Column 2 (Abstract), Line 5, change " $\Delta^1$ " to -- $\Delta_1$ --.

On Title page item 57 Column 2 (Abstract), change " $\Delta^1$ ." to -- $\Delta_1$ --.

Column 17, Line 35, change "dock" to --clock--.

Column 17, Line 38, change "docked" to --clocked--.

Column 18, Line 17, change "sold" to --said--.

Column 18, Line 25, change "comprising:" to --comprises:--.

Column 18, Line 27, change "end" to --and--.

Column 18, Line 46, change "claim 1;" to --claim 1,--.

Column 19, Line 5, change "docked" to --clocked--.

Column 19, Line 8, change "mote" to --more--.

Column 20, Line 33, change "dock" to --clock--.

Column 20, Line 36, change "end" to --and--.

Column 21, Line 63, change "dock" to --clock--.

Signed and Sealed this

Twenty-sixth Day of December, 2006

JON W. DUDAS
*Director of the United States Patent and Trademark Office*